(12) United States Patent
Gelman

(10) Patent No.: US 6,552,598 B2
(45) Date of Patent: Apr. 22, 2003

(54) SEMICONDUCTOR HIGH VOLTAGE ELECTRICAL ENERGY TRANSMISSION SWITCHING SYSTEM AND METHOD

(76) Inventor: Vitaly Gelman, VG Controls, 11 Butternut Dr., Vernon, NJ (US) 07462

( * ) Notice: Subject to any disclaimer, the term of this patent is extended or adjusted under 35 U.S.C. 154(b) by 0 days.

(21) Appl. No.: 09/910,095

(22) Filed: Jul. 20, 2001

(65) Prior Publication Data

US 2003/0016073 A1 Jan. 23, 2003

(51) Int. Cl.[7] .................................................. H03B 6/66
(52) U.S. Cl. ....................... 327/453; 327/447; 363/128; 323/210
(58) Field of Search ................................ 327/447, 453; 323/207, 242, 210; 363/128

(56) References Cited

U.S. PATENT DOCUMENTS

| | | | | |
|---|---|---|---|---|
| 4,308,494 A | * | 12/1981 | Gelfand et al. | 323/242 |
| 5,604,420 A | * | 2/1997 | Nambu | 322/19 |
| 5,754,035 A | * | 5/1998 | Sen | 323/207 |
| 5,981,925 A | * | 11/1999 | Parosa et al. | 219/715 |
| 6,294,879 B1 | * | 9/2001 | Nagase et al. | 315/224 |

* cited by examiner

Primary Examiner—Dinh T. Le

(57) ABSTRACT

A method for controlling fault interruption in a high voltage electrical energy transmission system semiconductor high voltage electrical energy transmission switching system which includes a multiple stack of power semiconductor SCR thyristor circuit sections arranged for single phase or three-phase operation with each section of the stack comprising; a pair of input and output terminals, a plurality of switching thyristors connected in series between the input and output terminals, an auxiliary power transformer having at least three windings with first and second windings interconnecting the input and output terminals of one section to the respective output and input terminals in each adjacent section of the stack such that the voltage difference between the first and second transformer windings is limited to the maximum voltage across the section. The system also includes an AC/DC power supply connected to the third winding of the auxiliary power transformer and a gate drive circuit for controlling the firing of the switching thyristors in said section comprising the steps of connecting in tandem a multiple stack of power semiconductor SCR thyristor circuit switching sections. The a gate drive circuit is connected to the gate terminals of the commutation SCR thyristor's for controlling the firing of the commutation SCR thyristor's in each section and the firing angle of the SCR thyristor's in each section is changed between 0° and 180° to allow for downstream protection coordination.

16 Claims, 7 Drawing Sheets

SEMICONDUCTOR HIGH VOLTAGE ELECTRICAL ENERGY TRANSMISSION SWITCHING SYSTEM AND METHOD

FIELD OF THE INVENTION

This invention relates to a semiconductor high voltage switching system and method for transmitting and distributing electrical power at very high voltage.

BACKGROUND OF THE INVENTION

The transmission and distribution of electrical power benefits from the use of high power semiconductor thyristor switches for the distribution of high voltage DC and for the commutation of AC at high voltage. To produce the voltage levels needed to provide power at voltage levels above 10 kv and up to 200 k volts or higher it is commonplace to combine a multiple number of Silicon Controlled Rectifiers SCR's (hereafter referred to as "thyristors") in series to form a semiconductor "valve". Conventional high voltage systems are designed using such semiconductor valves. To test the operation of a system using a semiconductor thyristor valve at multi kv voltage levels involves considerable safety considerations and makes the system very expensive to manufacture.

It is therefore the primary objective of the present invention to simplify the design and manufacture of a semiconductor high voltage electrical energy transmission switching system and to provide a high voltage semiconductor commutation circuit for single and/or three phase operation.

It has been discovered in accordance with the principals of the present invention that by forming a series stack of free floating circuit sections each composed of a predetermined number of semiconductor SCR thyristors in series, auxiliary power can be transferred through the stack of circuit sections by incorporating an auxiliary power transformer in each circuit section arranged such that the voltage difference between the power transformer windings applied to the opposite ends of each circuit section will be equal to the maximum voltage across each circuit section of the stack. Using this arrangement the voltage across each section can be limited to a voltage of, e.g. 10 k volts, which reduces the cost of the semiconductor and firing transformer elements and simplifies the testing of the circuit sections during manufacture and use. The number of sections in a stack will depend on the desired voltage to be applied across each section and the line voltage.

Additional benefits include a reduction in the number of spare parts (the switching system for different voltage levels are built from the same building block) and ease of maintenance in that a faulty section need only be replaced.

Each free floating circuit section in each phase may include any number of unidirectionally series connected thyristors. Alternatively, the thyristors in each section may be bi-directionally connected, i.e., connected in an antiparallel arrangement to allow current to pass in both directions and to permit forced commutation to turn off the thyristors if this is needed. Forced commutation is used to limit the fault current in a section before it rises to a level which will cause substantial damage to circuit breakers and other components (transformer, busses, etc.) elsewhere in the power system and/or to the components in the section. In the preferred forced commutation switch circuit embodiment of the present invention, applicable to single and three phase operation, the number of commutating capacitors in the switch circuit is reduced by a factor of two compared to conventional commutation switching circuits using semiconductor thyristors in which each semiconductor thyristor requires its own commutating capacitor. This is also true for the number of commutation inductors which is also reduced by a factor of two thereby further reducing the cost and weight/size of the section. For three-phase operation, each phase has a multiple stack of identical free floating circuit sections.

SUMMARY OF THE INVENTION

The semiconductor high voltage electrical energy transmission switching system of the present invention includes a multiple stack of power semiconductor SCR thyristor circuit sections arranged for single phase or three-phase operation with each section of the stack comprising; a pair of input and output terminals, a plurality of switching thyristors connected in series between the input and output terminals, an auxiliary power transformer having at least three windings with first and second windings interconnecting the input and output terminals of one section to the respective output and input terminals in each adjacent section of the stack such that the voltage difference between said first and second transformer windings is limited to the maximum voltage across said section, an AC/DC power supply connected to a third winding of said auxiliary power transformer and a gate drive circuit for controlling the firing of said switching thyristors in said section.

BRIEF DESCRIPTION OF THE DRAWINGS

Other advantages and objects of the present invention will become apparent from the following detailed description when read in conjunction with the accompanying drawings in which.

DETAILED DESCRIPTION OF THE PREFERRED EMBODIMENTS

Figure 1:
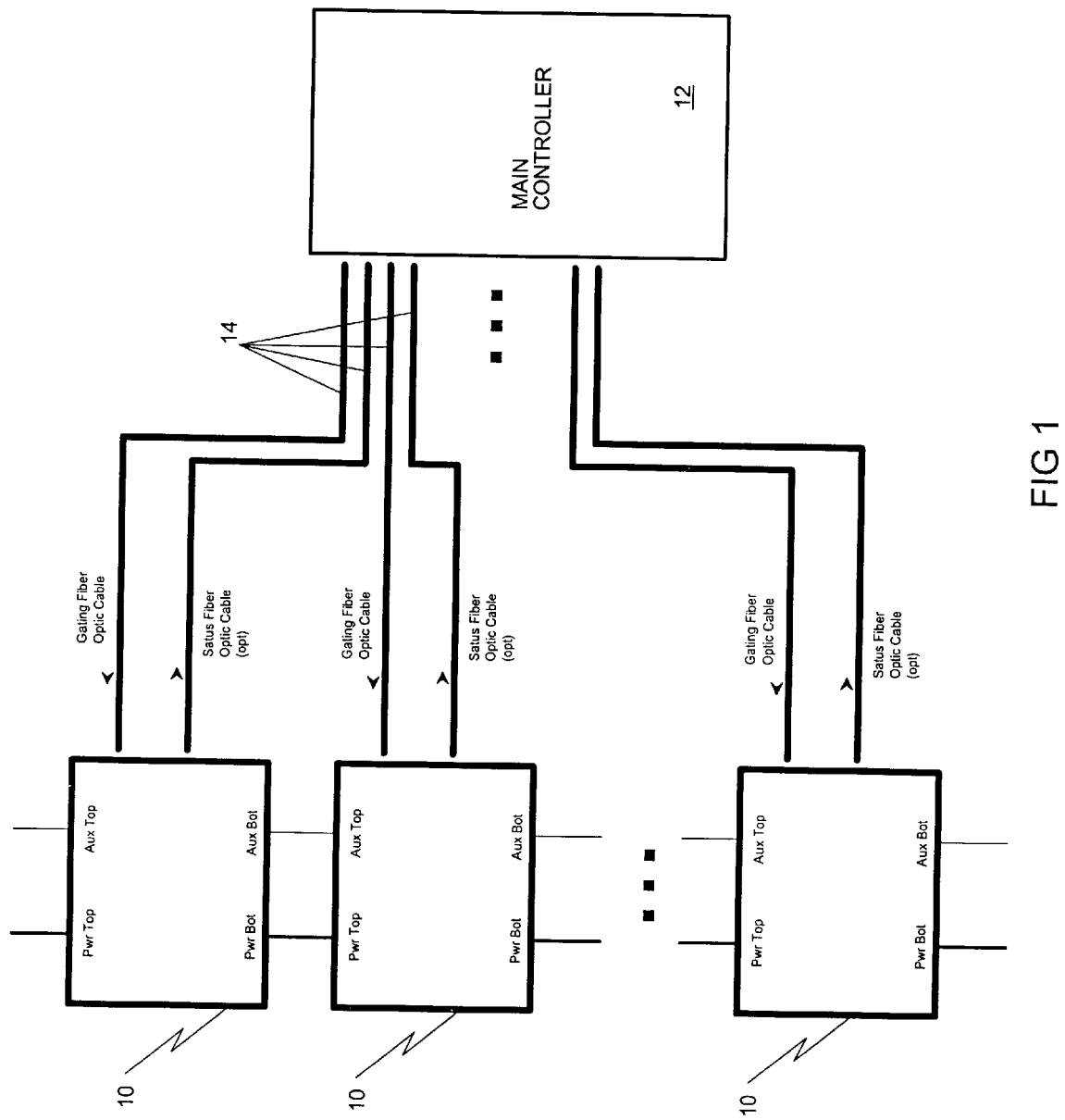
FIG. 1 is a schematic block diagram of a multiplicity of free floating sections in the switching system of the present invention stacked together in electrical series.

As can be seen in the arrangement of FIG. 1, a multiplicity of free floating sections 10 are coupled to one another using a first pair of terminals labeled "pwr top" and "aux top" at the top end of each section 10 and a second pair of terminals labeled "pwr bot" and "aux bot" at the bottom end of each section. The sections 10 are connected in tandem to form a single stack connected together in electrical series as will be evident from FIGS. 2 through 5 which will be explained in more detail hereafter. Each of the sections 10 receive auxiliary power from another auxiliary transformer (not shown) powered from a conventional line supply which is connected to the pair of terminal connections marked "pwr top" and "aux top" at the top end of the stack. Power is transferred through each section of the stack from the upper terminals of each section to the lower pair of terminals "pwr bot" and "aux bot" from whence power is transferred to the upper terminal "pwr top" and "aux top" in the next adjacent section in sequence. Control signals are fed to each section 10 from a common main controller 12. The connection from the main controller 12 to each section 10 may be via a bi-directional fiber optic link using duplex fiber optic cables 14 as shown in FIG. 1 or by means of a single bi-directional cable and multiplexor (not shown). The main controller 12 transmits gating signals to the sections 10 to turn them on and off and in the opposite direction receives signals from the respective sections 10.

Figure 2:
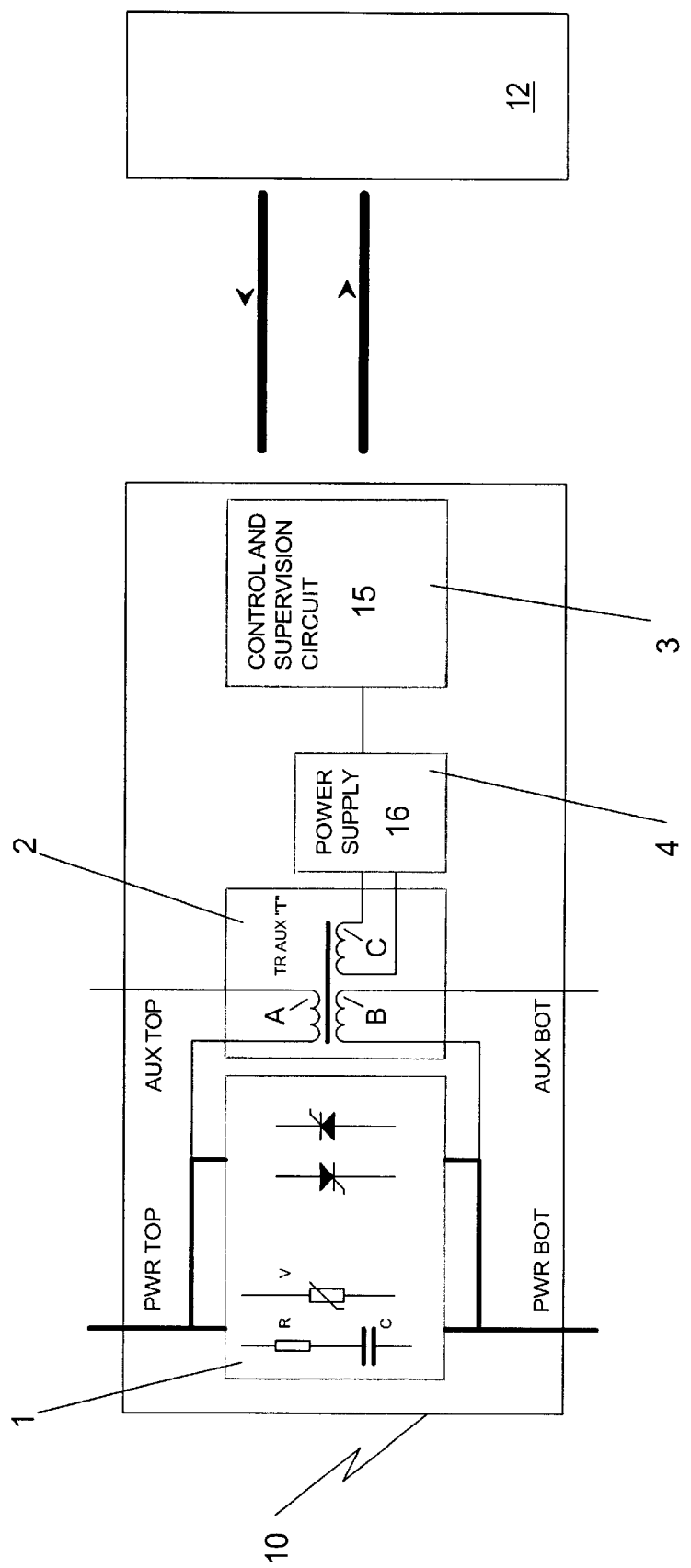
FIG. 2 is an enlarged schematic block diagram of a single section in FIG. 1.

The details of each section 10 in the multiple stack is shown in FIGS. 2 through 6 respectively. As indicated in FIG. 2 the section 10 has four parts inclusive of parts 1, 2, 3 and 4 respectively. Part 1 is a thyristor switching circuit containing power SCR's and voltage sharing and voltage limiting components such as resistive-capacitive snubbers and may also include varistors. The thyristor switching circuit may further include commutation means for bi-directional flow and means to achieve forced commutation. Part 2 includes an auxiliary power distribution transformer T. Part 3 is a control circuit 15 which, in turn, may be controlled from the main controller 12. Part 4 is power supply 16 of conventional design. The use of a control circuit 15 for supplying gate signals to fire the power SCR's is of itself conventional and does not need an independent description for one skilled in the art to understand. The auxiliary power distribution transformer T has three windings A, B and C with the two windings A and B connected to the "pwr top" and "pwr bot" terminals and the third winding C connected to the power supply 16. The third winding C isolates the power supply 16 and control circuit 15 in the section 10 in which they are connected. The first and second windings A and B of the auxiliary power transformer T interconnect the input and output terminals of a section 10, i.e., interconnects the opposite terminals of one section 10 to the respective output and input terminals in each adjacent section of the stack such that the maximum voltage difference between the first and second transformer windings A and B is equal to the maximum voltage across the section 10. In this way power is transferred through the sections of the stack and the voltage across the auxiliary transformer T is limited by the voltage across each section.

Figure 3:
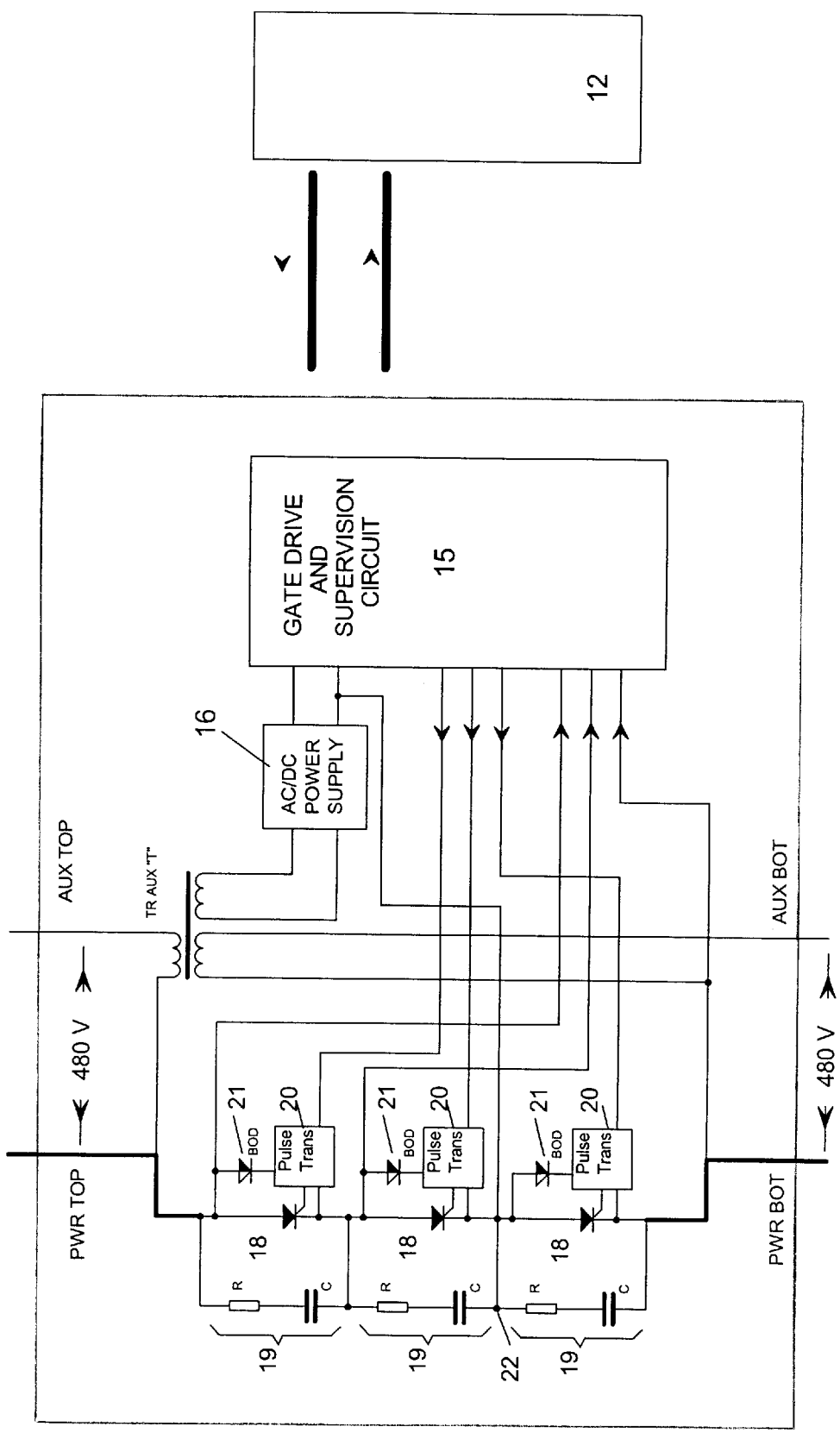
FIG. 3 is a schematic of one embodiment of a single section of FIG. 2 showing the circuit arrangement for an HVDC or other converter DC/AC application.

One preferred thyristor switching circuit arrangement for section 10 for use in an HVDC (high voltage direct current) application or for a converter DC/AC application is shown in FIG. 3. In this current arrangement the thyristor switching circuit includes three SCR's 18 connected to one another in series, an auxiliary power transformer T, an AC/DC power supply 16 and a control circuit 15. Each SCR 18 is connected to a voltage limiting RC snubber 19, a firing pulse transformer assembly 20 and a break over diode 21 ("BOD"). The firing pulse transformer assembly 20 and break over diode 21 are connected in series across the cathode to anode terminals of the SCR 18 with the pulse transformer 20 also connected to the gate terminal of the SCR 18. Should the voltage across an SCR 18 exceed a safe level this causes the appropriate BOD diode 21 to turn on which fires the SCR 18 in series therewith. Once fired the pulse transformer assembly 20 to which the SCR 18 is connected is bypassed. The pulse transformer assembly 20 itself is conventional and includes a firing pulse transformer, diode, resistor, etc. (not shown) as is well known to those skilled in the art. The firing of the SCR 18 in this manner saves it from destructive voltage breakdown.

It is preferred to connect the control circuit 15 to a common point 22 representing the cathode of the middle SCR 18. In this way the voltage between the control circuit 15 and any of the gates of the SCR's 18 is limited by the voltage across one SCR 18 which also limits the voltage across the pulse transformer assembly 20. Since the section 10 is free floating, i.e., not connected to ground potential and the common point 22 is tied to the cathode of the middle SCR 18, the control circuit 15 is at the same potential permitting a temperature sensor such as an RTD (not shown) to be used to monitor the temperature of the SCR 18. The voltages across each of the SCR's 18 in the section 10 can all be monitored using resistive dividers (not shown) to detect a short circuit. This can be directly reported to the main controller 12 through the control circuit 15. Moreover, the primary voltage across each gate terminal to the pulse transformer 20 can also be monitored to detect an open gate condition and this information can likewise be transmitted to the main controller 12 through the control circuit 15.

Figure 4:
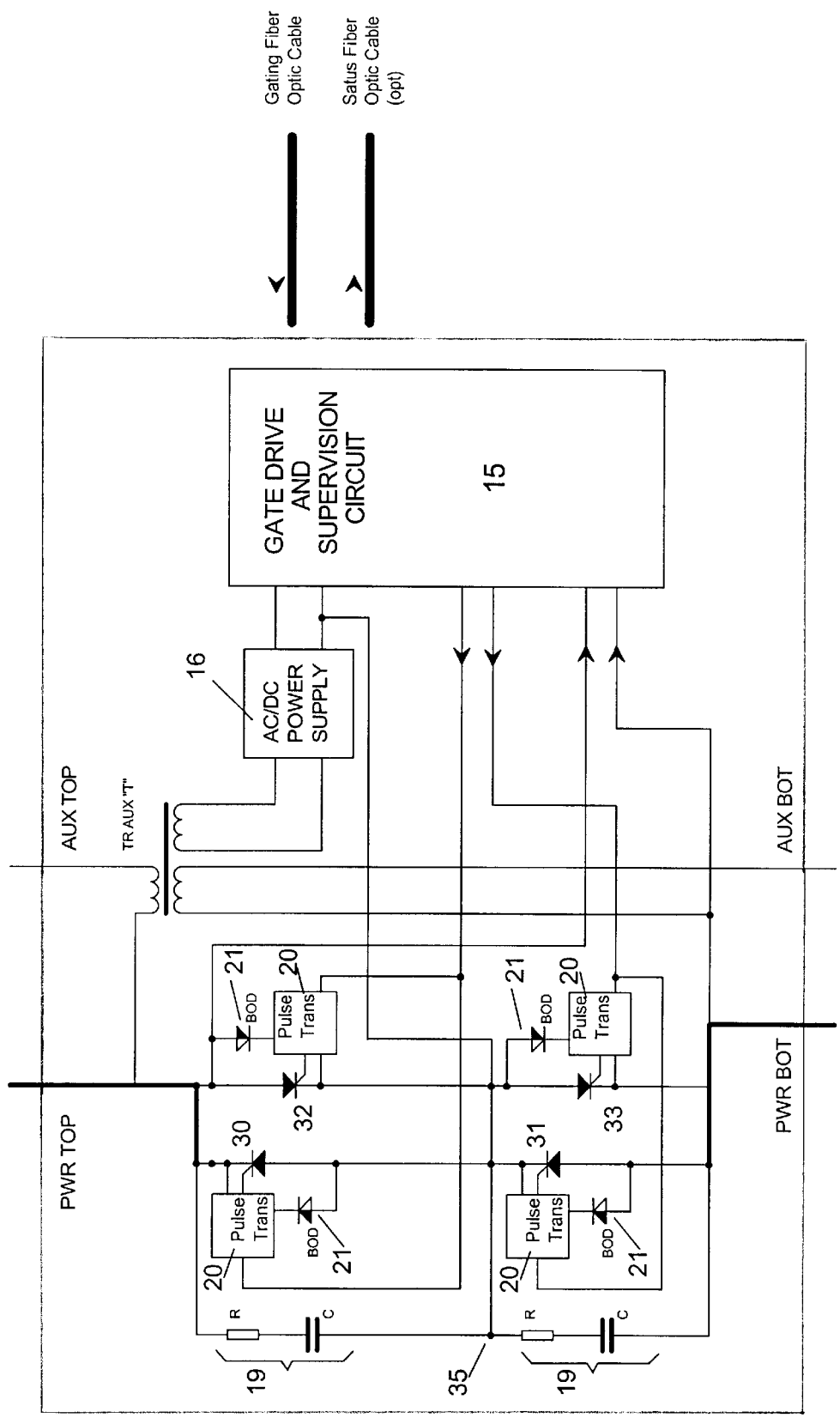
FIG. 4 is another embodiment of the schematic circuit diagram of FIG. 3 for bi-directional operation.

FIG. 4 is a circuit diagram of a single section 10 in which the thyristor switch is a bi-directional valve including a first series pair of SCR's 30 and 31 connected in an anti-parallel arrangement with a second series of SCR's 32 and 33 to allow current to pass in both directions. Two pairs of series connected SCR's are used in this circuit instead of the three series connected SCR arrangement of FIG. 3 to limit the voltage across the pulse transformer 20 to the peak voltage across the SCR to which that pulse transformer 20 is connected. The common point 35 of this circuit is located between each of the two pair of series connected SCR's 30, 31 and 32 and.33 respectively. A snubber circuit 19 composed of a resistor R and capacitor C (similar to FIG. 3) is connected from the common point 35 to the "pwr top" and to the "pwr bot" terminals at each opposite end of the section 10. The auxiliary transformer T, the AC/DC power supply 16 and the control circuit 15 is identical to the arrangement in FIG. 3.

Figure 5:
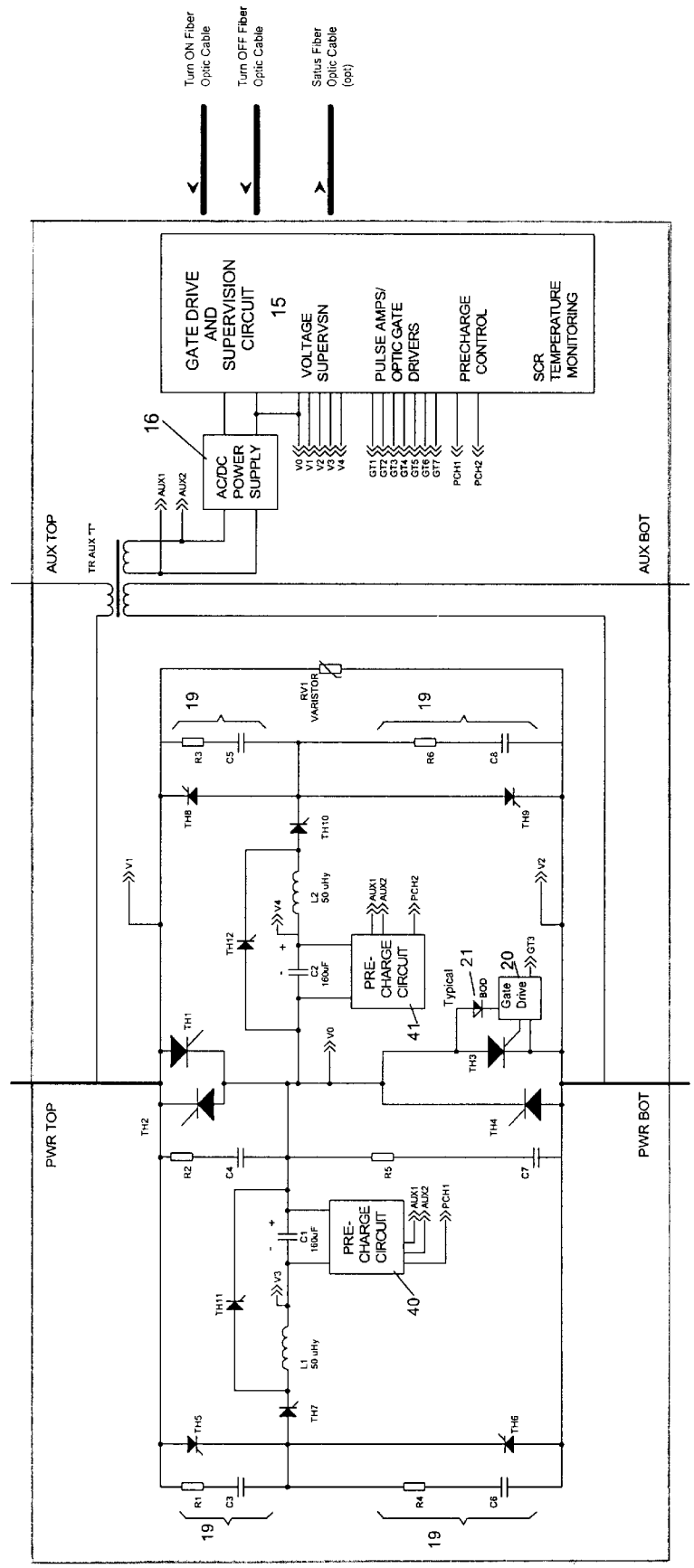
FIG. 5 is a circuit diagram of the arrangement of FIG. 4 modified in accordance with the present invention to achieve forced commutation.

The arrangement of FIG. 4 is shown modified in FIG. 5 to achieve forced commutation of the main thyristor SCR's TH1–TH4. For simplicity all of the components of FIG. 4 which are equivalent to their counterpart in FIG. 5 are identified with the same reference numbers except for the main and commutating thyristors which are labeled with the prefix "TH". For further clarity only one thyristor TH3 is shown with its gate terminal connected to a pulse transformer assembly 20 and BOD diode 21 with the understanding that each of the other thyristor's TH1, TH2 TH4 and TH12 also have their gate terminals connected to a pulse transformer assembly 20 which, in turn, is in series with BOD diode 21 in an arrangement equivalent to that of FIG. 3. Each pulse transformer assembly 20 in FIG. 5 is connected to a gate drive circuit terminal GT3 of the gate drive circuit 15 which, in turn, receives on/off signals from the main controller 12.

To achieve forced commutation in the circuit arrangement of FIG. 5 additional thyristors TH5 through TH10 are used as well as commutating capacitors C1 and C2 and commutating inductances L1 and L2. The commutating capacitors C1 and C2 may be recharged through a recharging circuit which includes additional thyristors TH11 and TH12 or the pre-charge circuits 40 and 41. In either case the recharging circuit includes the voltage limiting components R1–R6, capacitors C3–C8 and varistor RV1. The methodology for recharging the commutating capacitors C1 and C2 through the semiconductor SCR's TH11 and TH12 or by means of the pre-charge circuits 40 and 41 will be explained in greater detail hereinafter.

The main current in FIG. 5 is carried by the main SCR's TH1–TH4, while the capacitors C1 and C2 are charged with the polarity as shown. Should the current exceed a preset limit (or di/dt is exceeded) the main controller 12 will, in turn, issue a turn-OFF command generating gate signals which fire the commutating SCR's. Depending on the direction of current flow through the main SCR's. TH1–TH4 either. TH5, TH7, TH10, TH9 (for the positive main current, i.e., through TH1 and TH3) or through TH6, TH7, TH10, TH8 (for the negative main current flow i.e., through TH2 and TH4).

The circuit can operate without the commutating SCR's TH7 and TH10, but then the voltage applied to the commutating SCR's TH5, TH6, TH7, TH8 will be almost twice the voltage across the main SCR's (the main SCR's voltage plus a charged capacitor C! or C2 voltage). This would necessitate the series connection of two devices for all commutation SCR's bringing the total number of them to 8. By using two additional SCR's TH7 and TH10 we reduce the total number of commutating SCR's from 8 to 6 with related cost and weight/size savings. These additional SCR's are fired every time we need to force commutate the current, regardless of current direction.

If we assume that the main current is positive, i.e., the SCR's TH1 and TH3 are conducting then FIG. 5 provides two commutation SCR discharging circuits inclusive of a first discharging circuit including elements TH5, TH7, TH1, L1, C1 and a second discharging circuit including elements TH10, TH9, TH3, C2, L2. The capacitors C1 and C2 discharge through these two circuits. When capacitor currents reach the level of load current (current flowing through the main SCR's TH1 and TH3), the current through the SCR's TH1 and TH3 goes to zero and they are turned off. This switches the load current into the commutation circuit formed from elements TH5, TH7, L1, C1, C2, L2, TH10 and TH9. The current flow causes the voltage across the capacitors to go to zero and then recharge them with the opposite polarity. When the voltage across the capacitors reach the breakdown voltage of the varistor RV1, the current switches into the varistor RV1. At that point the current through all of the commutating SCR's TH5–TH10 goes to zero and they are turned off. The load current now flows only through the varistor RV1 .Once the energy is dissipated in the varistor the current decays to zero. At this point the turn-off process is completed but for the need to change the voltage polarity across the capacitors C1 and C2. This can be done using either the precharge circuits 40 and 41 or the SCR's TH11 and TH12. The disadvantages of using the precharge circuits 40 and 41 is a long time delay (of at least a few seconds) and power dissipation in the auxiliary power circuit. By using the SCR's TH11 and TH12, the capacitors C1 and C2 will recharge in a few hundred microseconds with virtually no energy dissipation. Once TH11 and TH12 are fired there are two recharge circuit configurations with the first inclusive of elements TH11, C1 and L1 and the second inclusive of elements TH12, L2 and C2 respectively. Following discharge the capacitors C1 and C2 will then recharge with opposite polarity.

Figure 6:
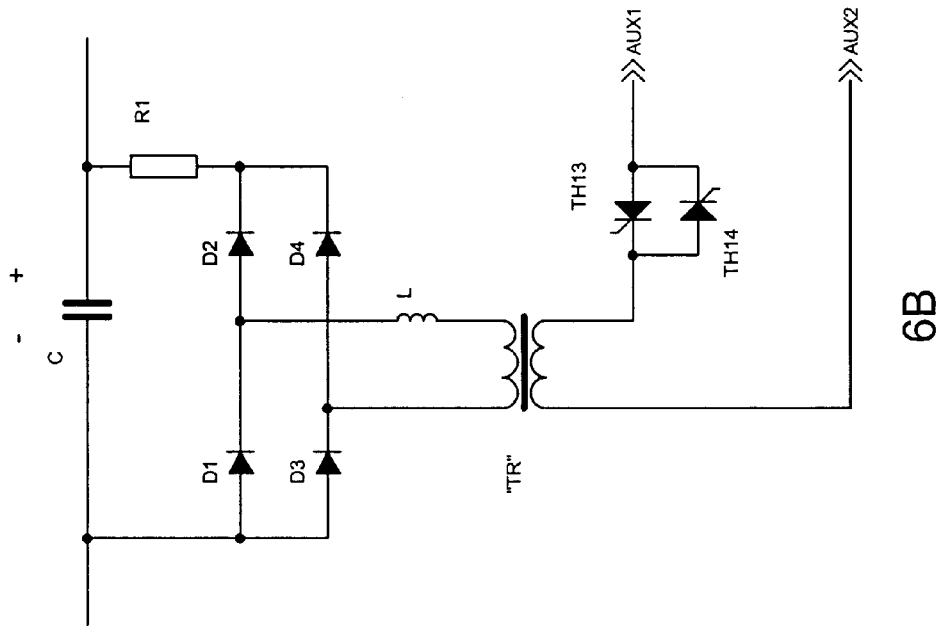
FIG. 6(A) is a circuit diagram of the pre-charge circuit in FIG. 5.
FIG. 6(B) is another circuit arrangement of the pre-charge circuit in FIG. 5.
Figure 6:
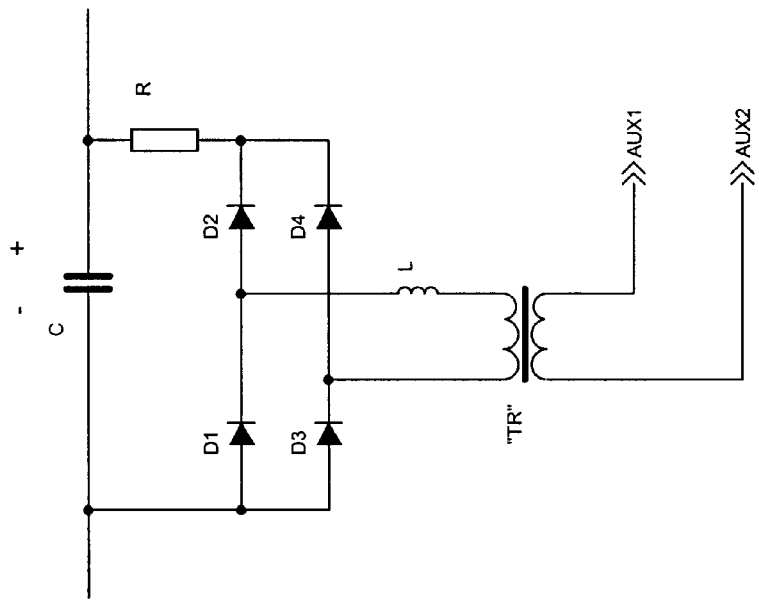

FIG. 6A shows the details of one embodiment of each of the precharge circuits 40 and 41. Capacitor C is one of the capacitors C1 and C2 from FIG. 5. As shown in FIG. 6 these capacitors charge through the transformer TR and a diode bridge D1–D4. An optional inductor L is used to limit charging current to avoid collapsing the voltage on the auxiliary power distribution chain although its function can be performed alternatively by the leakage inductance of the transformer TR's. Resistor R is needed to protect current flowing through the diodes D1–D4 when the capacitor voltage changes the polarity during commutation cycle; it is also can be used to limit the charging current instead of (or combined with) inductance L. The primary winding of the transformer TR is connected to the auxiliary power source, the third winding of the transformer T from FIG. 5.

FIG. 6B shows a circuit variation of FIG. 6A with additional anti-parallel connected SCR's TH13 and TH14 used on the primary winding side of transformer TR. By gating the SCR's TH13 and TH14 the charging process can be stopped when the capacitor voltage reaches a predefined value. In this way the capacitor voltage is independent of auxiliary voltage level and the charging cycle does not have a long tail.

Figure 7:
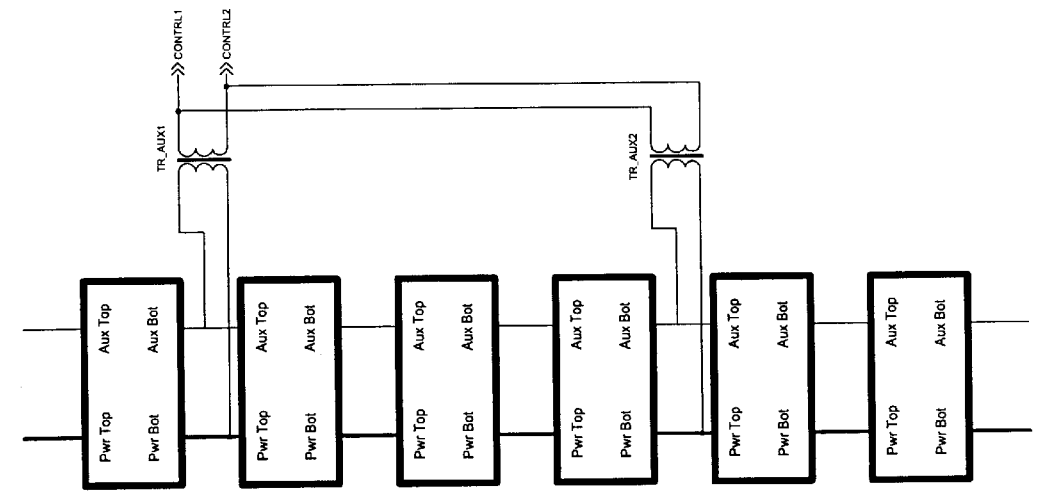
FIGS. 7(A–C) are functional block diagrams of alternate versions for distributing power between the sections of a multiple stack arrangement for use in a single or three-phase power distribution system in accordance with the present invention.
Figure 7:
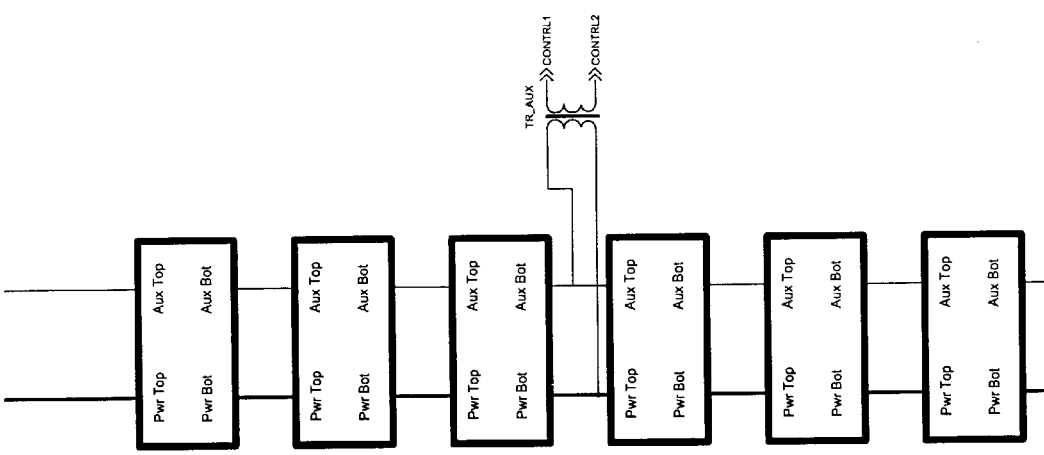
Figure 7:
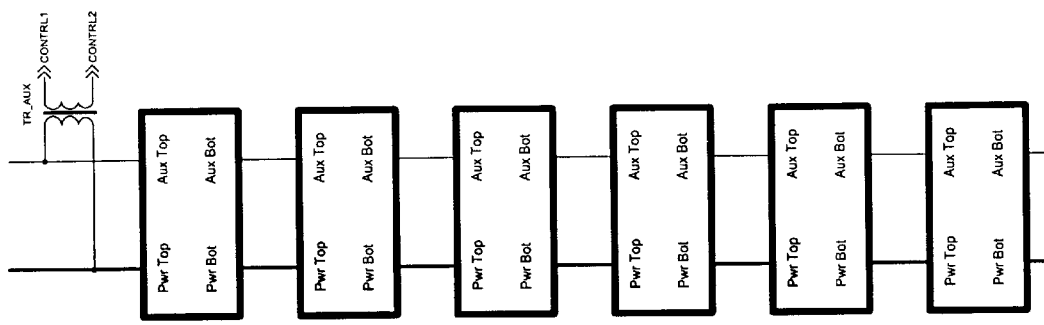

FIGS. 7A–7C show the details for auxiliary power distribution through the stack of multiple sections 10. FIG. 7A shows the simplest method of auxiliary power distribution in which the auxiliary power is fed through high voltage transformer TR-AUX at one end of the sections' string. This has the disadvantage in that power has to go through many sections in series suffering a substantial voltage drop due to section's auxiliary transformer internal impedances. In FIG. 7B the voltage drop is reduced by one half by feeding the power at the center of the string. In FIG. 7C two feed inputs at ¼ and ¾ positions along the string are used to reduce the voltage drop by four times.

Under normal conditions the circuit of FIG. 5 operates as a thryristor switch with main SCR's TH1–TH4. They are turned on with gradually decreasing firing angle to:

1. reduce switching transients ("soft start"), and
2. avoid turning into the fault by monitoring the current during the soft start process.

Once the circuit is successfully turned on the main SCR's conduct during the whole period until a fault condition is experienced or the normal turn-off command is received. If a normal turn-off command is received the firing angle of the main SCR's can be increased gradually to reduce the voltage ("soft stop") and then the pulses are removed, or the pulses can be removed immediately without changing the firing angle.

If the fault condition is detected (high current and/or high di/dt), gating signals fire the commutating SCR's the gating signals are removed from the main SCR's TH!–TH4 and the circuit goes through the current turn-off process as explained above.

If a fault interruption occurs in a high voltage electrical energy transmission system including the switching circuit of the present invention arrangement of FIG. 5 permits the main SCR's TH1–TH4 to be fired so as to generate a programmed number of high current bidirectional pulses to allow for "downstream protection coordination"which allows to isolate the fault. Moreover, the amplitude of the pulses may be regulated by changing the firing angle of the main SCR's TH1–TH4 similar to the soft start as described above so that the let through current is limited to a predetermined maximum value which will protect against the damaging of circuit breakers and other circuit elements. This can be accomplished by measuring the let through current (using the controller to monitor current) at different firing angles to achieve the desired current amplitude regardless of fault impedance. In this way both current limiting is achieved with the benefit of corresponding reduction in equipment stresses, improved service life as well as downstream protection coordination.

What I claim is:

1. A semiconductor high voltage electrical energy transmission switching system including a multiple stack of free floating power semiconductor thyristor circuit sections having separate input and output terminals respectively with each of said circuit sections being isolated from ground potential and arranged in tandem with the output terminals of one circuit section connected to the input terminals of an adjacent circuit section for distributing auxiliary electrical power sequentially through each of said circuit sections, with each section in the stack comprising: a plurality of SCR switching thyristors connected in series between the input and output terminals of the respective circuit section, with each SCR having a gate terminal, and further comprising gating means connected to the gate terminal of each SCR, isolation means including a transformer having a first and second winding for interconnecting the input and output terminals of one circuit section to the respective output and input terminals in each adjacent circuit section of the multiple stack such that the voltage difference between said first and second transformer winding is equal to no more than the maximum voltage across said circuit section, a power supply connected to said isolation means and a gate drive circuit for controlling the firing of said SCR switching thyristors in said circuit section through said gating means wherein the gate drive circuit is tied to an intermediate voltage point within said circuit section in common with said gating means and said power supply.

2. A semiconductor high voltage electrical energy transmission switching system as defined in claim 1 wherein said gating means comprises a pulse transformer connected to the gate terminal of each SCR with the gate drive circuit connected to each pulse transformer.

3. A semiconductor high voltage electrical energy transmission switching system as defined in claim 1 wherein said power supply is an AC/DC power supply.

4. A semiconductor high voltage electrical energy transmission switching system as defined in claim 3 wherein said plurality of thyristors includes at least three thyristors connected in series.

5. A semiconductor high voltage electrical energy transmission switching system as defined in claim 4 wherein the cathode of the middle of the three series connected thyristors is connected in common to the power supply and gate drive circuit.

6. A semiconductor high voltage electrical energy transmission switching system as defined in claim 3 wherein said plurality of thyristors comprises four main thyristors interconnected for bidirectional conductivity in a paired arrangement with each pair connected in electrical series and connected to the other pair so in an anti-parallel arrangement.

7. A semiconductor high voltage electrical energy transmission switching system as defined in claim 6 further comprising a first commutating capacitor and a first commutating inductor in series across one anti-parallel thyristor combination through one pair of commutating thyristors and a second commutating capacitor and second commutating inductor connected in series across the same anti-parallel thyristor combination in the opposite direction through the other pair of commutating thyristors.

8. A semiconductor high voltage electrical energy transmission switching system as defined in claim 7 further comprising a precharge circuit for each commutating capacitor to charge the commutating capacitors before forced commutation occurs and to recharge the commutating capacitor after they have been charged in the opposite polarity after forced commutation said precharge circuit comprising a transformer and a full bridge diode network.

9. A semiconductor high voltage electrical energy transmission switching system as defined in claim 7 further comprising a first thyristor connected across the series connected first commutating capacitor and commutating inductor and a second thyristor connected across the series connected second commutating capacitor and commutating inductor for recharging the first and second commutating capacitors in the opposite polarity.

10. A semiconductor high voltage electrical energy transmission switching system as defined in claim 7 further comprising a plurality of additional commutating SCR's arranged to force current to flow in one direction through the four main thyristors and through the first and second commutating capacitor and commutating inductor and in the opposite direction through the four main thyristors and in the same direction through the first and second commutating capacitor and commutating inductor.

11. A semiconductor high voltage electrical energy transmission switching system as defined in claim 10 further comprising a varistor connected in parallel across the four main thyristors.

12. A semiconductor high voltage electrical energy transmission switching system as defined in claim 8 wherein said precharge circuit comprises a full wave diode bridge arrangement and a transformer having a secondary winding connected to the diode bridge arrangement and a primary winding connected to said third winding of the auxiliary power transformer.

13. A semiconductor high voltage electrical energy transmission switching system as defined in claim 12 further comprising an inductor connected in series with the secondary winding of the transformer to limit charging current.

14. A semiconductor high voltage electrical energy transmission switching system as defined in claim 12 further comprising a pair of anti-parallel connected semiconductor SCR thyristor's in a series circuit arrangement with the primary winding of the transformer with the gate terminals of the anti-parallel connected semiconductor SCR thyristor's connected to the gate drive circuit for controlling the charging current level and capacitor voltage.

15. A method for controlling fault interruption in a high voltage electrical energy transmission AC network system including a multiple stack of free floating circuit sections isolated from ground potential with each circuit section including a plurality of semiconductor switching devices having a gate terminal, gating means connected to each gate terminal for firing the semiconductor switching devices in a controlled manner after a fault interruption occurs and a power supply, comprising the steps of arranging the multiple stack of free floating circuit sections in tandem with the output terminals of one circuit section connected to the input terminals of an adjacent circuit section for transferring auxiliary electrical power from the power supply through each circuit section sequentially, connecting the switching devices of each circuit section in series between the input and output terminals thereof and firing each semiconductor switching device by adjusting the firing angle of each such switching device in each circuit section between 0° and 180° so as to regulate the flow of current through each of the semiconductor switching devices to provide for downstream protection to the other circuit sections following the fault interruption.

16. A method as defined in claim 15 wherein each circuit section further comprises gating means connected to the gate terminal and isolation means including a transformer having a first and second winding arranged to interconnect the input and output terminals of one circuit section to the respective output and input terminals in each adjacent circuit section of the multiple stack such that the voltage difference between said first and second transformer winding is equal to no more than the maximum voltage across said circuit section and a gate drive circuit for controlling the firing of said switching devices in said circuit section through said gating means and tying the gate drive circuit to an intermediate voltage point within said circuit section in common with said gating means and said power supply.

* * * * *